US012609272B2

(12) United States Patent
Walter et al.

(10) Patent No.: US 12,609,272 B2
(45) Date of Patent: Apr. 21, 2026

(54) PARTICLE BEAM SYSTEM

(71) Applicant: Carl Zeiss Microscopy GmbH, Jena (DE)

(72) Inventors: Gero Walter, Westhausen (DE); Holger Doemer, Bopfingen (DE); Wolfgang Berger, Gerstetten (DE)

(73) Assignee: Carl Zeiss Microscopy GmbH, Jena (DE)

( * ) Notice: Subject to any disclaimer, the term of this patent is extended or adjusted under 35 U.S.C. 154(b) by 589 days.

(21) Appl. No.: 17/958,838

(22) Filed: Oct. 3, 2022

(65) Prior Publication Data

US 2023/0109124 A1 Apr. 6, 2023

(30) Foreign Application Priority Data

Oct. 4, 2021 (DE) .......................... 102021125639.9

(51) Int. Cl.
| | |
|---|---|
| *H01J 37/244* | (2006.01) |
| *H01J 37/09* | (2006.01) |
| *H01J 37/24* | (2006.01) |

(52) U.S. Cl.
CPC ............ *H01J 37/244* (2013.01); *H01J 37/09* (2013.01); *H01J 37/24* (2013.01);
(Continued)

(58) Field of Classification Search
CPC .......... H01J 37/244; H01J 37/09; H01J 37/24; H01J 2237/0266; H01J 2237/2443;
(Continued)

(56) References Cited

U.S. PATENT DOCUMENTS

| | | | | |
|---|---|---|---|---|
| 3,646,344 A | * | 2/1972 | Plows ................... | H01J 37/268 |
| | | | | 324/754.22 |
| 4,588,891 A | * | 5/1986 | Saito ..................... | H01J 37/265 |
| | | | | 250/310 |

(Continued)

FOREIGN PATENT DOCUMENTS

| | | |
|---|---|---|
| CN | 103871811 A | 6/2014 |
| CN | 111293017 A | 6/2020 |

(Continued)

OTHER PUBLICATIONS

T. E. Everhart et al., "Wide-band detector for micro-microampere low-energy electron currents", Journal of Scientific Instruments 37 (1960), pp. 246-248.

(Continued)

*Primary Examiner* — David A Vanore
(74) *Attorney, Agent, or Firm* — Fish & Richardson P.C.

(57) ABSTRACT

A particle beam system comprises a particle beam column, a detection system and a controller. The particle beam column is configured to generate a particle beam and to direct it onto a sample, as a result of which charged particles are emitted by the sample. The detection system detects charged particles and comprises: an electrode, which can accelerate the charged particles; a potential source, which applies an adjustable electrical potential to the electrode; a scintillator; and a light detector, which outputs a detection signal. The controller controls the potential source and is configured to change the potential on the basis of the detection signal such that the scintillator operates outside its saturation and such that the light detector operates outside its saturation.

15 Claims, 11 Drawing Sheets

(52) U.S. Cl.
CPC ................. *H01J 2237/0266* (2013.01); *H01J 2237/2443* (2013.01); *H01J 2237/2445* (2013.01)

(58) Field of Classification Search
CPC ....... H01J 2237/2445; H01J 2237/2605; H01J 37/28; H01J 2237/24495
See application file for complete search history.

(56) References Cited

U.S. PATENT DOCUMENTS

| | | | | |
|---|---|---|---|---|
| 5,608,218 | A * | 3/1997 | Sato | H01J 37/28 250/310 |
| 5,717,206 | A * | 2/1998 | Watanabe | H01J 37/28 250/397 |
| 6,265,812 | B1 * | 7/2001 | Watanabe | H01J 37/244 313/532 |
| 8,294,097 | B2 * | 10/2012 | Katane | H01J 37/244 250/397 |
| 8,952,328 | B2 * | 2/2015 | Sluijterman | H01J 37/244 250/397 |
| 11,092,702 | B1 * | 8/2021 | Fober | H01J 37/244 |
| 11,239,053 | B2 * | 2/2022 | Zeidler | H01J 37/3177 |
| 11,348,757 | B2 * | 5/2022 | Yabu | G02B 19/0009 |
| 11,515,120 | B2 * | 11/2022 | Sekiguchi | G02B 6/4214 |
| 11,545,334 | B2 * | 1/2023 | Komatsuzaki | H01J 37/22 |
| 2001/0035495 | A1 * | 11/2001 | Nagai | H01J 37/28 250/311 |
| 2002/0166963 | A1 * | 11/2002 | Kondo | H01J 37/28 250/311 |
| 2002/0166966 | A1 * | 11/2002 | Ogawa | G01N 23/225 250/311 |
| 2003/0116709 | A1 * | 6/2003 | Kazumori | H01J 37/28 250/307 |
| 2005/0173644 | A1 * | 8/2005 | Gnauck | H01J 37/244 250/370.11 |
| 2006/0151700 | A1 * | 7/2006 | Honda | H01J 37/28 250/310 |
| 2007/0138388 | A1 * | 6/2007 | Ward | H01J 37/08 250/288 |
| 2007/0187621 | A1 * | 8/2007 | Ward | H01J 37/20 250/492.21 |
| 2008/0099674 | A1 | 5/2008 | Bihr et al. | |
| 2008/0308742 | A1 * | 12/2008 | Gerlach | H01J 37/28 250/397 |
| 2008/0315094 | A1 * | 12/2008 | Wang | H01J 37/28 250/311 |
| 2010/0038534 | A1 * | 2/2010 | Hendrich | H01J 37/263 250/307 |
| 2011/0095178 | A1 * | 4/2011 | Giannakopulos | H01J 37/244 250/281 |
| 2011/0215241 | A1 * | 9/2011 | Wang | G01N 23/00 250/311 |
| 2011/0291010 | A1 * | 12/2011 | Katane | H01J 37/244 250/310 |
| 2012/0145898 | A1 * | 6/2012 | Wang | H01J 37/244 250/397 |
| 2012/0205539 | A1 * | 8/2012 | Hlavenka | H01J 37/224 250/307 |
| 2012/0241609 | A1 * | 9/2012 | Kuramoto | H01J 37/28 250/310 |
| 2013/0043388 | A1 | 2/2013 | Hatano et al. | |
| 2014/0001357 | A1 * | 1/2014 | Graupera | H01J 37/244 250/306 |
| 2016/0203948 | A1 * | 7/2016 | Huynh | H10N 60/0884 250/398 |
| 2017/0032952 | A1 * | 2/2017 | Verenchikov | H01J 49/0031 |
| 2017/0133194 | A1 * | 5/2017 | Zeidler | H01J 37/28 |
| 2017/0162364 | A1 | 6/2017 | Guerra | |
| 2018/0247790 | A1 * | 8/2018 | Li | H01J 37/28 |
| 2019/0318905 | A1 * | 10/2019 | Preikszas | H01J 37/22 |
| 2019/0355545 | A1 * | 11/2019 | Zeidler | H01J 37/21 |
| 2020/0273664 | A1 | 8/2020 | Wang et al. | |
| 2022/0115203 | A1 * | 4/2022 | Bizen | H01J 37/1472 |
| 2023/0065039 | A1 * | 3/2023 | Essers | H01J 37/244 |
| 2023/0109124 | A1 * | 4/2023 | Walter | H01J 37/28 250/310 |
| 2024/0136146 | A1 * | 4/2024 | Zeidler | H01J 37/1474 |

FOREIGN PATENT DOCUMENTS

| | | |
|---|---|---|
| CN | 112106168 A | 12/2020 |
| DE | 10126698 A1 | 7/2002 |
| DE | 11 2010 005 188 T5 | 10/2012 |
| DE | 11 2016 001 147 T5 | 11/2017 |
| EP | 2 487 703 A1 | 8/2012 |

OTHER PUBLICATIONS

Hitachi High-Technologies Corporation: Instruction Manual For Model S-4800 Field Emission Scanning Electron Microscope, Part No. 539-8050, 2002, Company Writing, pp. 1-194.
J. B. Griffin, "A Comparison of Conventional Everhart-Thornley Style and In-Lens Secondary Electron Detectors—A Further Variable in Scanning Electron Microscopy", Scanning 33 (2011), pp. 162-173.
German Office Action, with translation thereof, for corresponding DE application No. 10 2021 125 639.9, dated Jul. 13, 2022.
Office Action in Chinese Appln. No. 202211210551.1, mailed on Oct. 30, 2025, 18 pages (with English translation).

* cited by examiner

P2

Process for changing the potential
applied to the electrode (E)

S201

Recording an image by means of the
particle beam system

S202

Apply analysis procedure to image,
image analysis result thereby
being obtained

S203

Does image
analysis result
correspond to predefined
criterion?

no yes

S204

Changing the potential applied to
the electrode (E)

P3

Process for changing the potential applied to the electrode (E)

S301

Obtain application data

S302

On the basis of application data obtained, determine an expected value corresponding to expected current of the charged particles

S303

Changing the potential applied to the electrode (E) on the basis of the expected value determined

PARTICLE BEAM SYSTEM

CROSS-REFERENCE TO RELATED APPLICATION

This application claims benefit under 35 U.S.C. § 119 to German Application No. 10 2021 125 639.9, filed Oct. 4, 2021. The contents of this application is hereby incorporated by reference in its entirety.

FIELD

The present disclosure relates to a particle beam system comprising a detection system for detecting charged particles which are emitted by a sample as a result of interaction of a particle beam with the sample. As an example, the disclosure relates to an electron beam system comprising a detection system for detecting electrons which are emitted by a sample as a result of interaction of an electron beam with the sample.

BACKGROUND

EP 2 487 703 A1 discloses what could be considered a conventional detection system which is used in a particle beam microscope. The detection system comprises a scintillator, a light guide connected to the scintillator, and a light detector connected to the light guide. The scintillator emits light on account of charged particles (in particular electrons) impinging on the scintillator, the light being fed to the light detector by the light guide. The light detector detects the light and outputs a detection signal representing the detected light. The light detector amplifies the light with an adjustable gain factor. The gain factor is adjusted such that the light detector operates below its saturation limit.

Such a conventional detection system is able to specify a current intensity of an electric current formed from charged particles to be detected, by way of the detection signal. The range of the current intensity of the electric current in which the detection system operates outside its saturation is referred to as the input dynamic range of the detection system. The gain factor brings about an increased input dynamic range since, in the case of an increased current intensity of the current of charged particles to be detected, the gain factor can be reduced in order to keep the detection signal below the saturation limit.

However, the configuration of such a conventional detection system is not able to sufficiently accurately detect very high current intensities of the current of the charged particles to be detected, even if the gain factor is reduced. Accordingly, the imaging dynamic range is generally restricted at very high current intensities of the current of the charged particles to be detected in a particle beam microscope. This can lead, inter alia, to reduced image contrasts, non-linearities in the imaging characteristic, but can also lead to temporal signal blur and thus, in the image, blurred controls and ghost images.

SUMMARY

The present disclosure proposes a particle beam system which is able to reduce the disadvantages mentioned above.

The particle beam system according to the disclosure comprises: a particle beam column configured to generate a particle beam and to direct it onto a sample, as a result of which charged particles are emitted by the sample; a detection system for detecting the charged particles, wherein the detection system comprises an electrode, a potential source, a scintillator and a light detector, wherein the potential source is configured to apply an adjustable electrical potential to the electrode, as a result of which the charged particles can be accelerated to the scintillator, wherein the scintillator is configured to emit light as a result of interaction of the charged particles with the scintillator, and wherein the light detector is configured to detect the light emitted by the scintillator and to output a detection signal corresponding to the detected light; and a controller, which controls the potential source and is configured to change the potential such that the scintillator operates outside its saturation and such that the light detector operates outside its saturation.

The electrode can bring about an adjustable acceleration for charged particles as a result of the adjustable electrical potential applied to the electrode. As a result, the current intensity—fed to the scintillator—of an electric current composed of charged particles to be detected can be adjustable, as a result of which a large input dynamic range can be realized. This process can function in detail as follows.

The electrode accelerates the charged particles to the electrode in a variably adjustable manner, as a result of which the kinetic energy of the charged particles impinging on the scintillator is variably adjustable. The kinetic energy of a charged particle impinging on the scintillator crucially determines the number of photons which are generated from the particle by the scintillator and are emitted by the scintillator. That is to say that the kinetic energy of the charged particles impinging on the scintillator crucially determines the number of photons generated from the particles and emitted by the scintillator. This conversion ratio of generated photons for each charged particle is adjustable on account of the adjustable electrical potential.

The electrode steers the charged particles to the electrode, i.e. a change in the trajectory of the charged particles, which brings about an increase in the charged particles impinging on the scintillator. The increase is adjustable, however, on account of the adjustable potential.

In a first operating mode, the sample is in a high vacuum. The high vacuum is generated in a vacuum chamber in which the sample is arranged. A high vacuum mechanism, for example, that a pressure of at most 0.1 pascal is present in the vacuum chamber. In the first operating mode, particles emanating from the sample and generated as a result of interaction with the particle beam and the sample collide with gas particles in the vacuum chamber to a non-significant extent on their way to the scintillator on account of the high vacuum. Charged particles or radiation generated as a result of collisions of the particles emanating from the sample with the gas in the vacuum chamber as a result of interaction on their way to the scintillator therefore contribute(s) to the detection signal to a negligible degree.

In a second operating mode, the sample is not in a high vacuum, but rather in a gas environment. A gas environment mechanism, for example, that a pressure of at least 1 pascal is present in the vacuum chamber in which the sample is arranged. In the second operating mode, particles emanating from the sample and generated as a result of interaction with the particle beam and the sample collide with gas particles in the vacuum chamber to a significant extent on their way to the scintillator on account of the gas environment.

Charged particles generated as a result (impact ionization) are in turn accelerated by the electrode of the detection system and can for their part collide again with gas particles in the vacuum chamber, as a result of which a cascade of impact ionizations can be triggered. The number of charged particles impinging on the scintillator can be greatly increased as a result. The increase is adjustable, however, an account of the adjustable potential.

Besides charged particles, radiation in the form of light can also be generated during such impact processes. If it reaches the light detector, it is detected by the light detector and increases the detection signal in this way. The increase is adjustable, however, on account of the adjustable potential.

The gas in the vacuum chamber can be air or a specially supplied gas (for example nitrogen, water vapour or the like). The pressure in the vacuum chamber can be adjusted by a vacuum pump and/or a gas supply system, for example. The vacuum pump and the gas supply system can be controlled by the controller.

The light detector can be for example a light detector in accordance with one of the following types: photomultiplier (PMT), silicon photomultiplier (SiPM), low gain avalanche photodetector (LGAD), avalanche photodiode (APD), photodiode (PN), PIN photodiode, microchannel plate (MCP) and the like.

The controller adjusts the electrical potential applied to the electrode such that neither the scintillator nor the light detector operates in saturation. Saturation is defined as follows, for example: A device which generates an output signal (for example emitted light, detection signal, etc.) depending on an input signal (for example charged particles, light, etc.) has an operating range, in which a change in the input signal leads to a change in the output signal, and a saturation range, in which a change in the input signal no longer leads to a change in the output signal or leads only to a significantly smaller change compared with the change in the operating range. The operating range defines the input dynamic range. In the saturation range, the output signal no longer uniquely maps the input signal. The device operates outside its saturation when it operates in the operating range, and operates in saturation when it operates in the saturation range.

What is achieved in accordance with an aspect of the present disclosure is that neither the scintillator nor the light detector operates in saturation by virtue of the detection signal being used to adjust and/or to change the electrical potential applied to the electrode. By way of example, on the basis of the detection signal, the controller checks whether or not a predefined criterion is satisfied, the result of the check indicating whether or not the detection system is operating outside its saturation or is operating close to its saturation. The controller then changes the electrical potential applied to the electrode if the result of the check indicates that the detection system is operating in saturation or close to its saturation.

What is achieved in accordance with an aspect of the present disclosure is that neither the scintillator nor the light detector operates in saturation by virtue of the fact that the potential is adjusted and/or changed on the basis of application data, the application data being stored in a data storage unit and specifying information about the sample and/or information about an adjustment of at least one operating parameter of the particle beam column. By way of example, on the basis of the application data, the controller determines an expected value specifying an expected current of the charged particles, and adjusts the potential such that the expected value satisfies a predefined condition according to which neither the scintillator nor the light detector operates in saturation.

Embodiments of the disclosure are explained in greater detail below with reference to figures.

DETAILED DESCRIPTION

Figure 1:
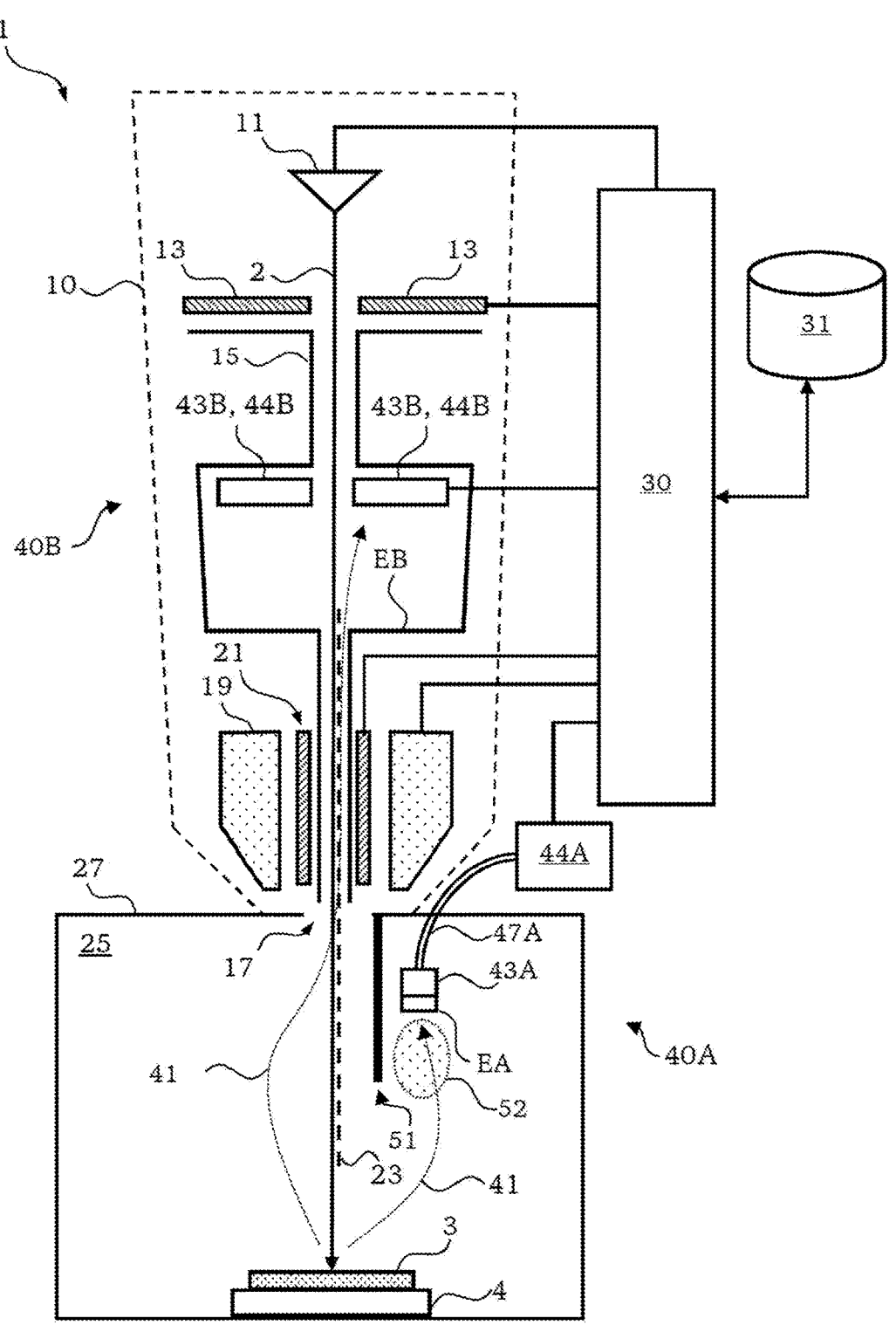
FIG. 1 shows an exemplary configuration of a particle beam system.

FIG. 1 shows an exemplary particle beam system 1 suitable for carrying out the methods and processes described herein, in particular for analysing and/or processing a sample 3.

The particle beam system 1 comprises a particle beam column 10. The particle beam column 10 comprises a particle source 11 configured to generate a particle beam 2 composed of charged particles. The particle beam 2 is formed from electrons or ions, for example.

The particle beam column 10 furthermore comprises an acceleration electrode 13, to which an electrical potential can be applied in order to accelerate the particles of the particle beam 2 to a predetermined kinetic energy.

The particle beam column 10 furthermore comprises a beam tube 15 arranged downstream of the acceleration electrode 13. The particles of the particle beam 2 accelerated by the acceleration electrode 13 pass in the beam tube 15 and emerge from the beam tube 15 and the particle beam column 10 at an opening 17. An electrical potential can be applied to the beam tube 15.

The particle beam column 10 furthermore comprises a particle-optical lens 19 (objective lens) suitable for focusing the particle beam 2 onto the sample 3. The particle-optical lens 19 is designed as a magnetic lens, for example. The particle-optical lens 19 is one example of a component for manipulating the particle beam 2.

The particle beam column 10 furthermore comprises a deflection system 21 suitable for deflecting the particle beam 2, such that the particle beam 2 can be directed onto different locations of the surface of the sample 3. The deflection system 21 can be suitable for deflecting the particle beam 2 along two directions oriented perpendicularly to one another, which are each in turn oriented perpendicularly to a central axis 23 of the particle-optical lens 19. The deflection system 21 is one example of a component for manipulating the particle beam 2.

The particle beam system 1 furthermore comprises a vacuum chamber 25. The vacuum chamber 25 has a chamber wall 27 spatially delimiting the vacuum chamber 25. A vacuum can be generated in the vacuum chamber 25. The vacuum chamber 25 is connected to the particle beam column 10 at the opening 17, through which the particle beam 2 can enter the vacuum chamber 25.

A sample stage 4 is arranged in the vacuum chamber 25. The sample stage 4 serves for carrying, spatially positioning and orienting the sample 3.

The particle beam system 1 furthermore comprises a controller 30 that is configured to control the components of the particle beam system 1. In particular, the controller 30 is configured to control the particle beam column 10. In particular, the controller 30 is configured to control the particle source 11, the electrical potential applied to the acceleration electrode 13, the electrical potential applied to the beam tube 15, the particle-optical lens 19 and the deflection system 21. The sample stage 4 can be controlled by the controller 30, such that the controller 30 can spatially position and orient the sample 3.

The particle beam system 1 furthermore comprises a data storage unit 31 configured to store data. The controller 30 can read data from the data storage unit 31 and write data to the data storage unit 31. The data storage unit 31 stores application data, for example.

Application data comprise data which are used by the controller 30 for controlling the components of the particle beam system 1, and can comprise further information. By way of example, the application data comprise information about the sample 3, such as, for example, information about the structure of the sample, information about the chemical composition of the sample, and the like By way of example, the application data comprise information about a (present) adjustment of the operating parameters of the particle beam system 1, in particular of the particle beam column 10. The operating parameters of the particle beam system 1 denote parameters of the particle beam system 1 which have to be defined by the controller for operation of the particle beam system 1. The operating parameters include in particular the (present) current intensity of the particle beam 2, the electrical potential applied to the acceleration electrode 13, the electrical potential applied to the beam tube 15, the excitation of the particle-optical lens 19 and the excitation of the deflection system 21. The operating parameters include in practice numerous further parameters that are not explicitly represented by an assigned structure in FIG. 1, such as, for example, the pressure within the beam tube 15, the pressure within the vacuum chamber 25, the positioning of the sample 3, the adjustment of the sample stage 4 and the like.

The particle beam system 1 furthermore comprises a plurality of detection systems 40A, 40B suitable in each case for detecting charged particles 41 generated as a result of interaction of the particle beam 2 with the sample 3. The charged particles 41 can be, in particular, backscattered electrons, secondary electrons, backscattered ions or secondary ions. The detection systems described herein are also referred to as detection system 40 if a particular differentiation of the detection systems is not required.

The detection system 40 is suitable for outputting a detection signal representing the quantity and/or the energy of the detected particles 41. By way of example, the detection signal represents a current intensity of an electric current formed by the charged particles 41. The controller 30 can receive the detection signal from the detection system 40 and process it and display it on a display device, for example.

Some more detailed configurations of the detection system 40 will be explained later with reference to FIGS. 6 to 8.

The configuration of the detection system 40 will firstly be explained with reference to FIG. 2. The detection system 40 comprises an electrode E, a potential source 42, a scintillator 43 and a light detector 44.

Figure 2:
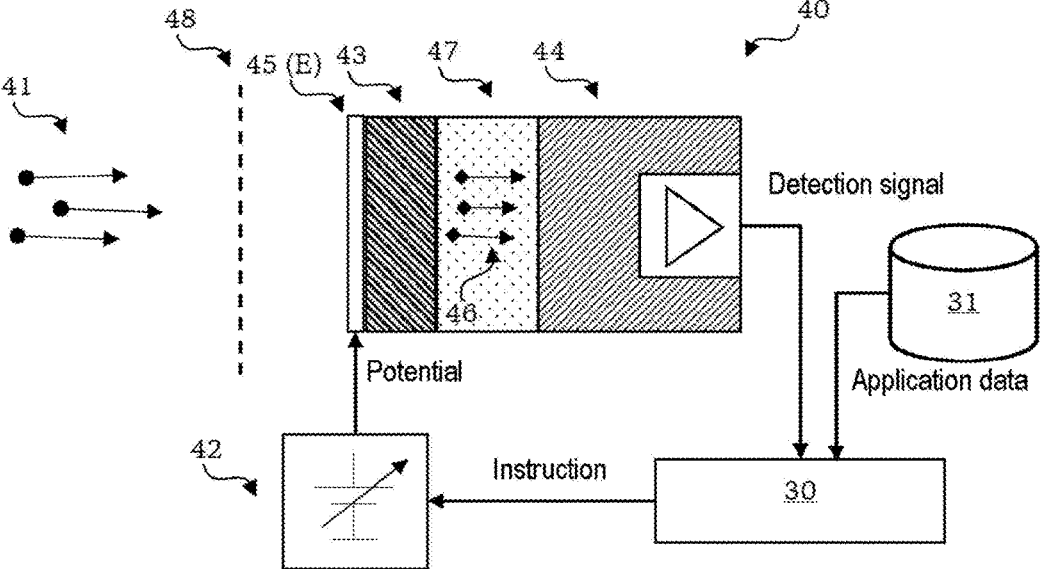
FIG. 2 shows an exemplary configuration of a detection system.

In the example shown in FIG. 2, the electrode E is provided by a metal grid 45 arranged on the scintillator 43. The electrode E is arranged at the front side of the scintillator 43, i.e. at the side at which the charged particles 41 impinge on the scintillator 43. Alternatively, the electrode E can be arranged at the rear side of the scintillator 43, i.e. at the side opposite the front side of the scintillator 43. As a further alternative, the electrode E can be provided by the scintillator 43 itself.

The potential source 42 is configured to apply an adjustable electrical potential to the electrode E As a result, the charged particles 41 can be accelerated, as a result of which the current intensity of the current which is formed from the charged particles 41 and which impinges on the electrode E and the scintillator 43 can also be changed. By virtue of the adjustable electrical potential, the quantity of charged particles generated as a result of impact ionization and the amount of light generated as a result, which contribute to the detection signal, are additionally adjustable. By way of example, it holds true that: The greater the adjusted potential, the greater the current intensity.

The scintillator 43 is configured to emit light 46 as a result of interaction of the charged particles 41 with the scintillator 43. In the example shown in FIG. 2, the light 46 emitted by the scintillator 43 is guided to the light detector 44 by a light guide 47. The light guide 47 can be an optical fibre, an imaging optical unit or the like.

The light detector 44 is configured to detect the light 46 emitted by the scintillator 43 and to output a detection signal corresponding to the detected light 46. The detection signal is for example an electrical signal which is received by the controller 30 and can be processed by the latter.

In the example shown in FIG. 1, the particle beam system 1 comprises the detection systems 40A and 40B. One portion of the components of the detection system 40A, namely the electrode EA, the scintillator 43A and one portion of the light guide 47A, is arranged within the vacuum chamber 25. Another portion of the components of the detection system 40A, namely the other portion of the light guide 47A, the light detector 44A and the potential source 42 (not illustrated), is arranged outside the vacuum chamber 25. The light guide 47A penetrates through the chamber wall 47. By contrast, in the case of the detection system 40B, all components apart from the potential source 42 (not illustrated) are arranged in the vacuum of the particle beam column 10. The electrode EB provided by the beam tube 15, the scintillator 43B and the light detector 44B of the detection system 40B are arranged within the particle beam column 10. Further configurations will be described later with reference to FIG. 8.

The detection system 40 shown in FIG. 2 furthermore comprises a collector electrode 48, to which an electrical potential is likewise applied. In this case, the collector electrode 48 assists the electrode E in guiding the charged particles 41 to the scintillator 43. However, the collector electrode 48 can also be used as an energy filter by virtue of the electrical potential applied to the collector electrode 48 being adjusted such that charged particles can pass the collector electrode 48 only if the kinetic energy of the charged particles is greater than a value defined by the potential. In this case, the electrode E has the effect, for example, that the charged particles that have passed the collector electrode 48 are accelerated to the scintillator 43 and, if appropriate, trigger a cascade of impact ionizations.

The controller 30 controls the potential source 42, i.e. the controller 30 can instruct the potential source 42 to adjust and to change the potential to a value defined by the instruction. The controller 30 is configured to adjust and/or to change the potential such that the scintillator 43 operates outside its saturation and such that the light detector 44 operates outside its saturation. As a result, the detection system 40 has a high input dynamic range and ensures that the detection signal provides a correct mapping of the current intensity of the current of the charged particles 41 or of the light 46 impinging on the light detector 44.

The controller 30 can be configured to adjust and/or to change the potential on the basis of the detection signal and/or on the basis of the application data. Examples of a controller based on the detection signal will be described with reference to FIGS. 3 and 4. An example of a controller based on the application data will be described with reference to FIG. 5.

The potential can be varied in the range of 50 V to 12 kV relative to earth, for example. That is to say that the potential can also be adjusted to values which are significantly different from the customary application range of approximately 8 kV to 10 kV relative to earth.

As is shown by way of example in FIG. 2, the light detector 44 is configured to amplify a signal of the detected light 46 with a gain which is adjustable up to a maximum gain, and to output the amplified signal as the detection signal. The controller can adjust the potential applied to the electrode E on the basis of the detection signal and/or the application data such that the light detector 44 would operate outside its saturation even if the light detector 44 were adjusted to its maximum gain. By way of example, information specifying the present gain of the light detector 44 and information specifying the maximum gain of the light detector 44 are stored in the data storage unit 31. By dividing the detection signal by the value of the present gain and multiplying that by the maximum gain, it is possible to calculate for example an estimated value that approximately specifies the detection signal with the use of maximum gain. The controller 30 can change the potential applied to the electrode E on the basis of the estimated value such that the scintillator 43 and the light detector 44 would operate outside their saturation even if the light detector 44 were adjusted to its maximum gain.

The potential can be changed continuously. That is to say that the potential is constantly adjusted anew. The potential can be adjusted repeatedly, for example at periodic intervals. The adjustment of the potential can be triggered by an event, for example by an instruction from the controller 30 that is triggered by the result of a check of a predetermined criterion, or by an instruction from a user.

A description is given below, with reference to FIGS. 3A to 3C, 4 and 5, of exemplary processes carried out by the controller 30 in order to change the potential on the basis of the detection signal.

Figure 3A:
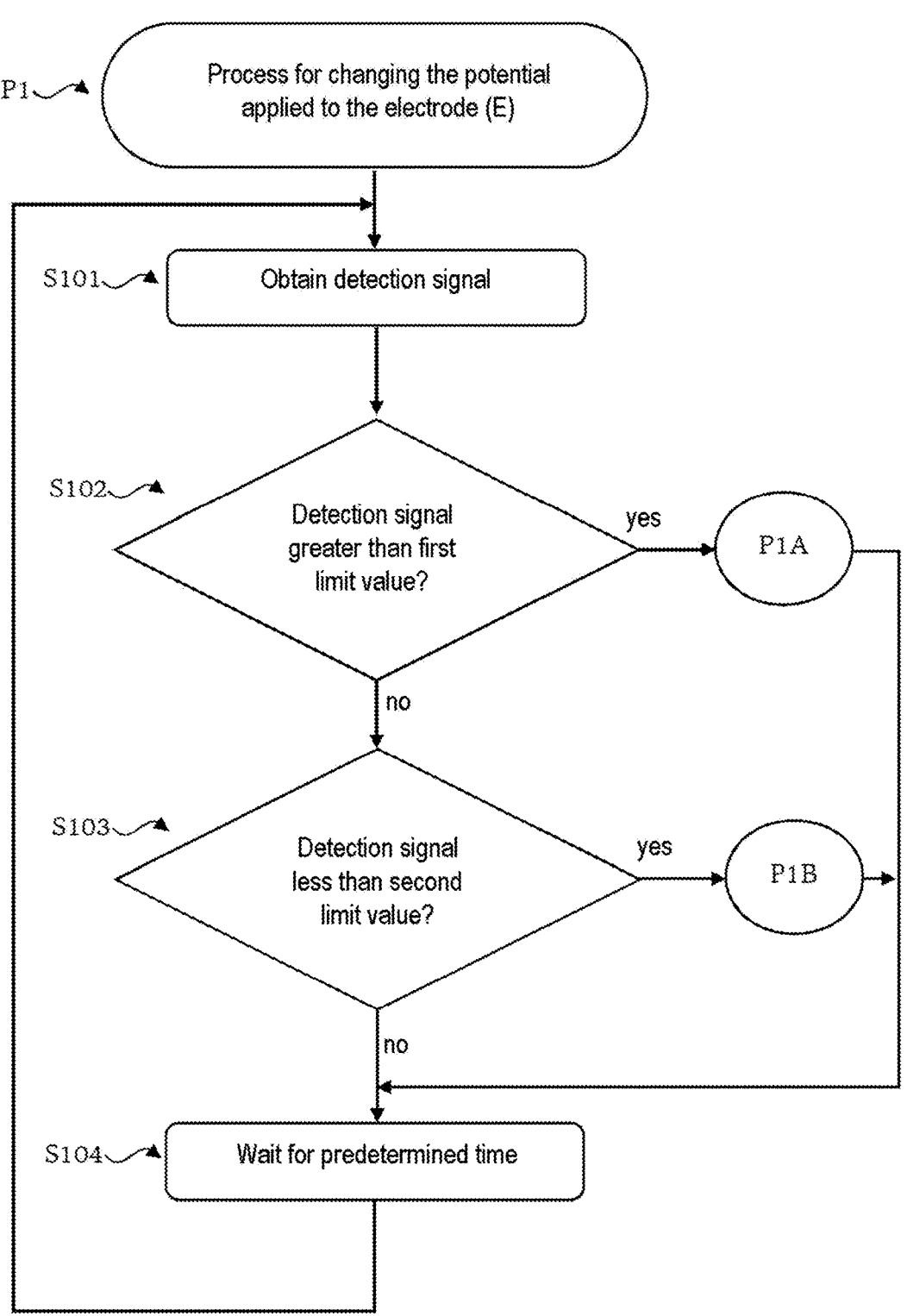
FIGS. 3A-3C show an exemplary process for changing an electrical potential applied to an electrode.
Figure 3B:
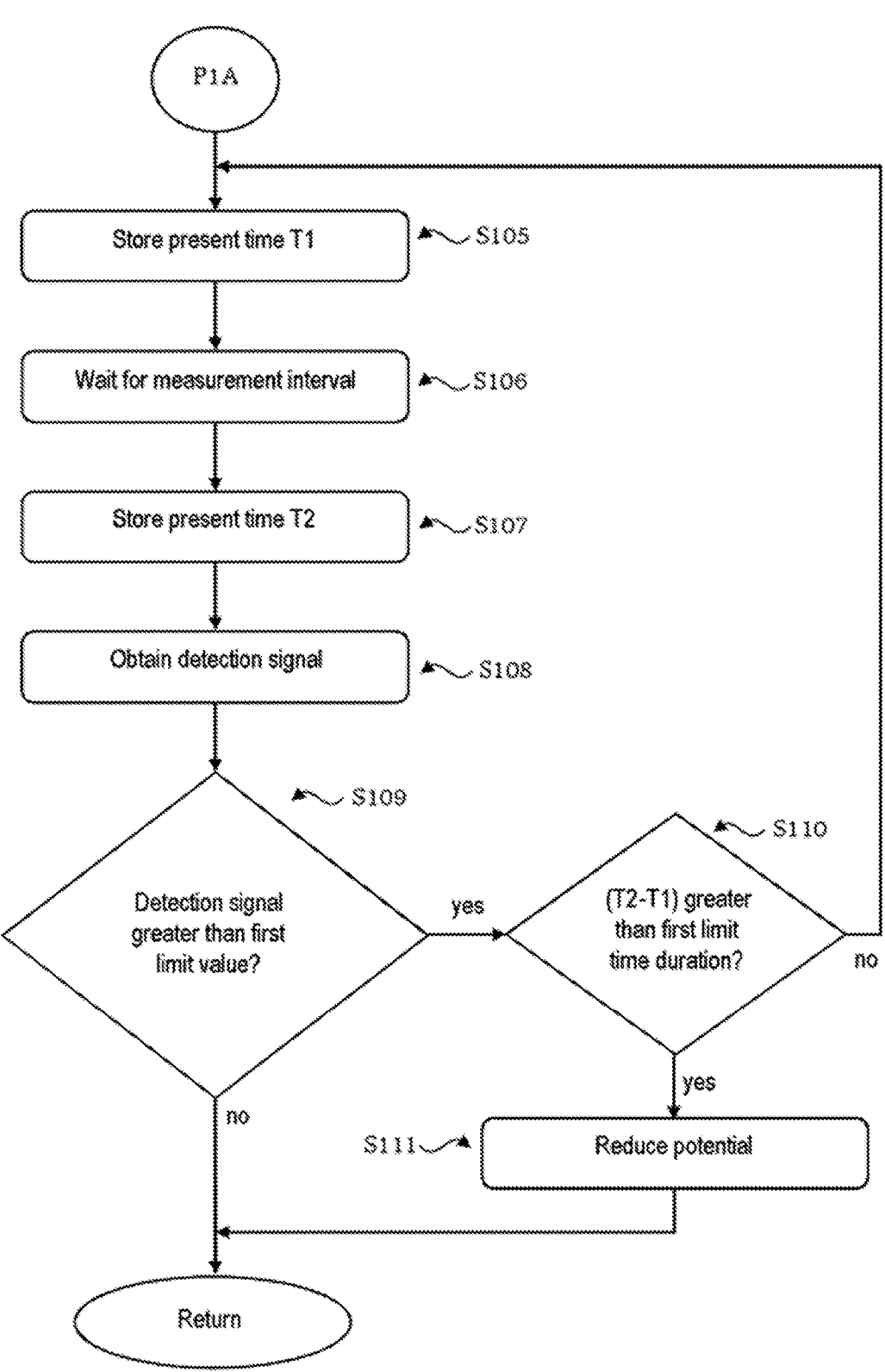
Figure 3C:
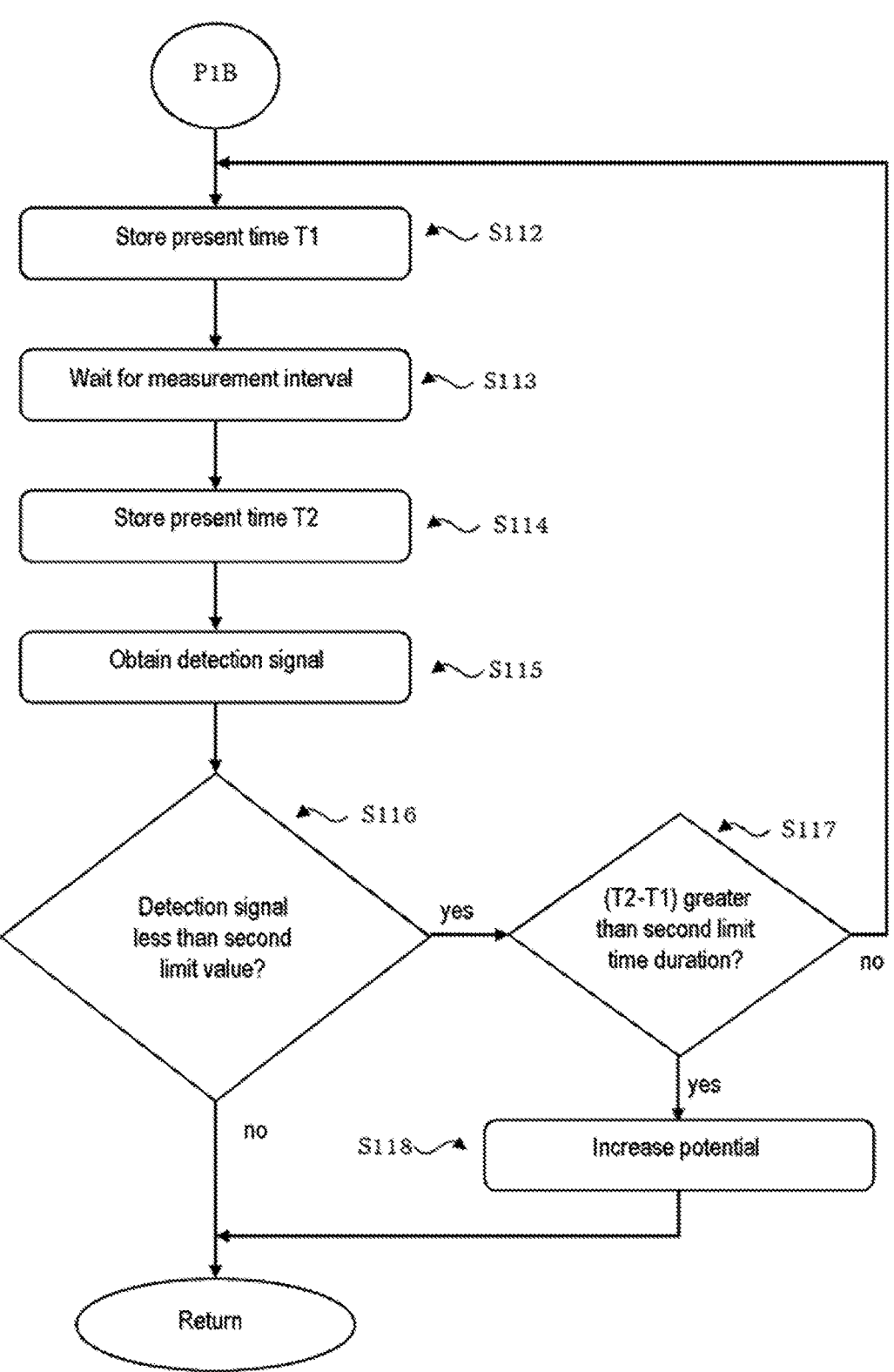

FIGS. 3A to 3C show a first process P1 for changing the potential applied to the electrode E.

In step S101, the controller 30 obtains the detection signal from the light detector 44. By way of example, the controller 30 stores in the data storage unit 31 a value indicating a digitized value of the detection signal.

In step S102, the controller 30 determines whether the detection signal obtained in step S101 is greater than a first limit value. The first limit value is stored in the data storage unit 31, for example, and specifies as of what value of the detection signal the presence of saturation is checked and ascertained. The first limit value can be adjusted by a user and can be determined empirically, for example.

If it is determined in step S102 that the detection signal is greater than the first limit value, the section P1A shown in FIG. 3B is carried out. If it is determined in step S102 that the detection signal is not greater than the first limit value, the controller 30 carries out step S103.

In step S103, the controller 30 determines whether the detection signal obtained in step S101 is less than a second limit value. The second limit value is stored in the data storage unit 31, for example, and specifies as of what value of the detection signal the presence of a potential adjusted to be too low is checked and ascertained. The second limit value can be adjusted by a user and can be determined empirically, for example.

If it is determined in step S103 that the detection signal is less than the second limit value, the section P1B shown in FIG. 3C is carried out. If it is determined in step S103 that the detection signal is not less than the second limit value, the controller 30 carries out step S104.

In step S104, the controller 30 waits for a predetermined time. The value of the predetermined time is stored in the data storage unit 31, for example, and specifies at what intervals the first process P1 is intended to be repeated. After step S104 has been carried out, the controller 30 repeats the process P1 beginning with step S101.

In the section P1A, the controller 30 checks whether a permanent saturation is present. Firstly, in step S105, the controller 30 stores the present time T1 in the data storage unit 31.

In step S106, the controller 30 waits for a predetermined time (measurement interval). The value of the measurement interval is stored in the data storage unit 31, for example, and specifies at what intervals a check is intended to be made to establish whether the saturation already ascertained is still present.

In step S107, the controller 30 stores the present time T2 in the data storage unit 31.

In step S108, the controller 30 obtains the detection signal from the light detector 44.

In step S109, the controller 30 determines whether the detection signal obtained in step S108 is greater than the first limit value. That is to say that the controller 30 checks whether or not the saturation is still present.

If it is determined in step S109 that the detection signal is greater than the first limit value (i.e. the saturation is still present), the controller 30 carries out step S103. If it is determined in step S109 that the detection signal is not greater than the first limit value (i.e. the saturation is no longer present), the controller 30 carries out step S104.

In step S110, the controller 30 determines whether or not the difference between the stored time T2 and the stored time T1 is greater than a first limit time duration. The first limit time duration is stored in the data storage unit 31, for example, and specifies for how long a saturation is present until it is ascertained that a permanent saturation is present. The first limit time duration can be adjusted by a user.

If it is determined in step S110 that the difference between the stored time T2 and the stored time T1 is not greater than the first limit time duration (i.e. the saturation has not yet been present for long enough to ascertain a permanent saturation), the controller 30 carries out the section P1A once again starting from step S105. If it is determined in step S110 that the difference between the stored time T2 and the stored time T1 is greater than the first limit time duration (i.e. the saturation has been present for long enough to ascertain a permanent saturation), the controller 30 reduces the potential applied to the electrode E in step S111. As a result, fewer charged particles 41 are guided to the scintillator 43, as a result of which the scintillator 43 and the light detector 44 no longer operate in saturation.

In the section P1B, the controller 30 checks whether the potential applied to the electrode E is permanently adjusted to an excessively low value. Firstly, in step S112, the controller 30 stores the present time T1 in the data storage unit 31.

In step S113, the controller 30 waits for a predetermined time (measurement interval). The value of the measurement interval is stored in the data storage unit 31, for example, and specifies at what intervals a check is intended to be made to establish whether the adjustment of the potential already ascertained as excessively low is still present.

In step S114, the controller 30 stores the present time T2 in the data storage unit 31.

In step S115, the controller 30 obtains the detection signal from the light detector 44.

In step S116, the controller 30 determines whether the detection signal obtained in step S115 is less than the second limit value. That is to say that the controller 30 checks whether or not the adjustment of the potential ascertained as excessively low is still present.

If it is determined in step S116 that the detection signal is less than the second limit value (i.e. the adjustment of the potential ascertained as excessively low is still present), the controller 30 carries out step S117. If it is determined in step S116 that the detection signal is not less than the second limit value (i.e. the adjustment of the potential ascertained as excessively low is no longer present), the controller 30 carries out step S104.

In step S117, the controller 30 determines whether or not the difference between the stored time T2 and the stored time T1 is greater than a second limit time duration. The second limit time duration is stored in the data storage unit 31, for example, and specifies for how long an adjustment of the potential ascertained as excessively low is present until it is ascertained that the adjustment of the potential already ascertained as excessively low is permanent. The second limit time duration can be adjusted by a user.

If it is determined in step S117 that the difference between the stored time T2 and the stored time T1 is not greater than the second limit time duration (i.e. the adjustment of the potential ascertained as excessively low has not yet been present for long enough to ascertain that the adjustment of the potential ascertained as excessively low is permanent), the controller 30 carries out the section P1B once again starting from step S112. If it is determined in step S117 that the difference between the stored time T2 and the stored time T1 is greater than the second limit time duration (i.e. the adjustment of the potential ascertained as excessively low has been present for long enough to ascertain that the adjustment of the potential ascertained as excessively low is permanent), the controller 30 increases the potential applied to the electrode E in step S118. As a result, more charged particles 41 are guided to the scintillator 43, as a result of which the scintillator 43 and the light detector 44 output a higher detection signal.

By way of the first process P1, the electrical potential applied to the electrode E is changed depending on the detection signal.

Figure 4:
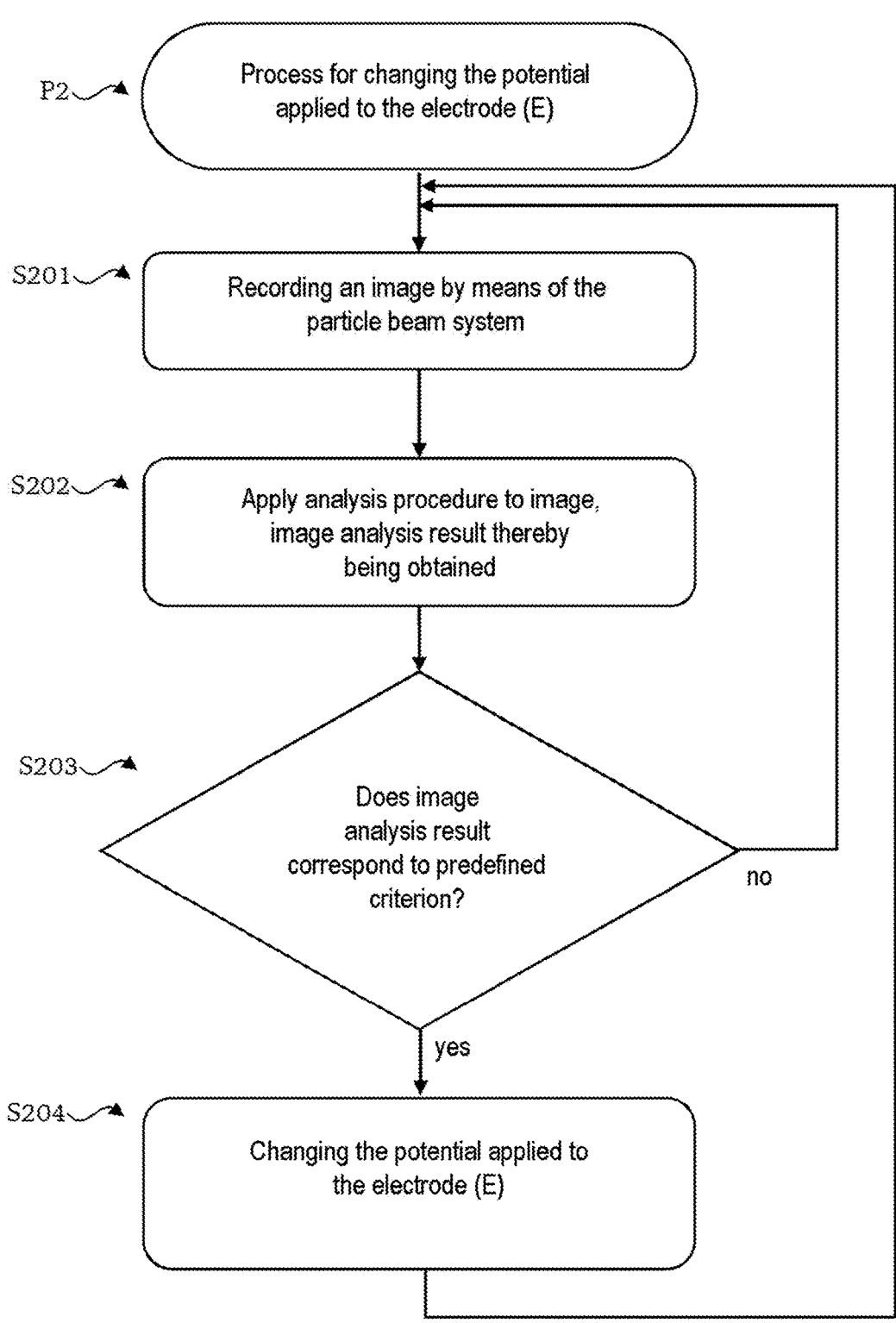
FIG. 4 shows an exemplary process for changing the electrical potential applied to the electrode.

FIG. 4 shows an exemplary second process P2 for changing the electrical potential applied to the electrode E. In step S201, the controller 30 instigates the recording of an image of the sample 3 with use and control of the components of the particle beam system 1. The image is obtained for example by scanning the particle beam 2 over the sample 3 and simultaneously recording the detection signal. On the basis of the detection signal, the controller 30 generates image data representing the image and stores the image data in the data storage unit 31.

In step S202, the controller 30 applies an analysis procedure to the image recorded in step S201, an image analysis result thereby being obtained. The analysis procedure can be for example a predefined procedure stored in the data storage unit 31. The analysis procedure is for example such that the image analysis result represents a maximum value of the intensity values represented by the image. The analysis procedure is for example such that the image analysis result represents a mean value of the intensity values represented by the image. The analysis procedure is for example such that the image analysis result represents a median value of the intensity values represented by the image. Other analysis procedures that characterize the intensities in the image can be used.

In step S203, the controller 30 determines whether or not the image analysis result determined in step S202 corresponds to a predefined criterion. The criterion is stored in the data storage unit 31, for example, and can be configured by a user. By way of example, the criterion can comprise a check against a limit value, as is the case for example in steps S102 and S103 of the process P1. More complex checks are possible.

If it is determined in step S203 that the image analysis result corresponds to the predefined criterion (i.e. that the potential ought to be changed), the controller 30 carries out step S204. If it is determined in step S203 that the image analysis result does not correspond to the predefined criterion, the controller 30 repeats the process starting from step S201.

In step S204, the controller 30 changes the potential applied to the electrode E. In particular, the controller 30 changes the potential applied to the electrode E on the basis of the image analysis result.

By way of the second process P2, the electrical potential applied to the electrode E is changed depending on the detection signal.

The processes P1 and P2 described above are two examples of a process by which the controller 30 changes the electrical potential applied to the electrode E using the detection signal. Other processes are possible.

Figure 5:
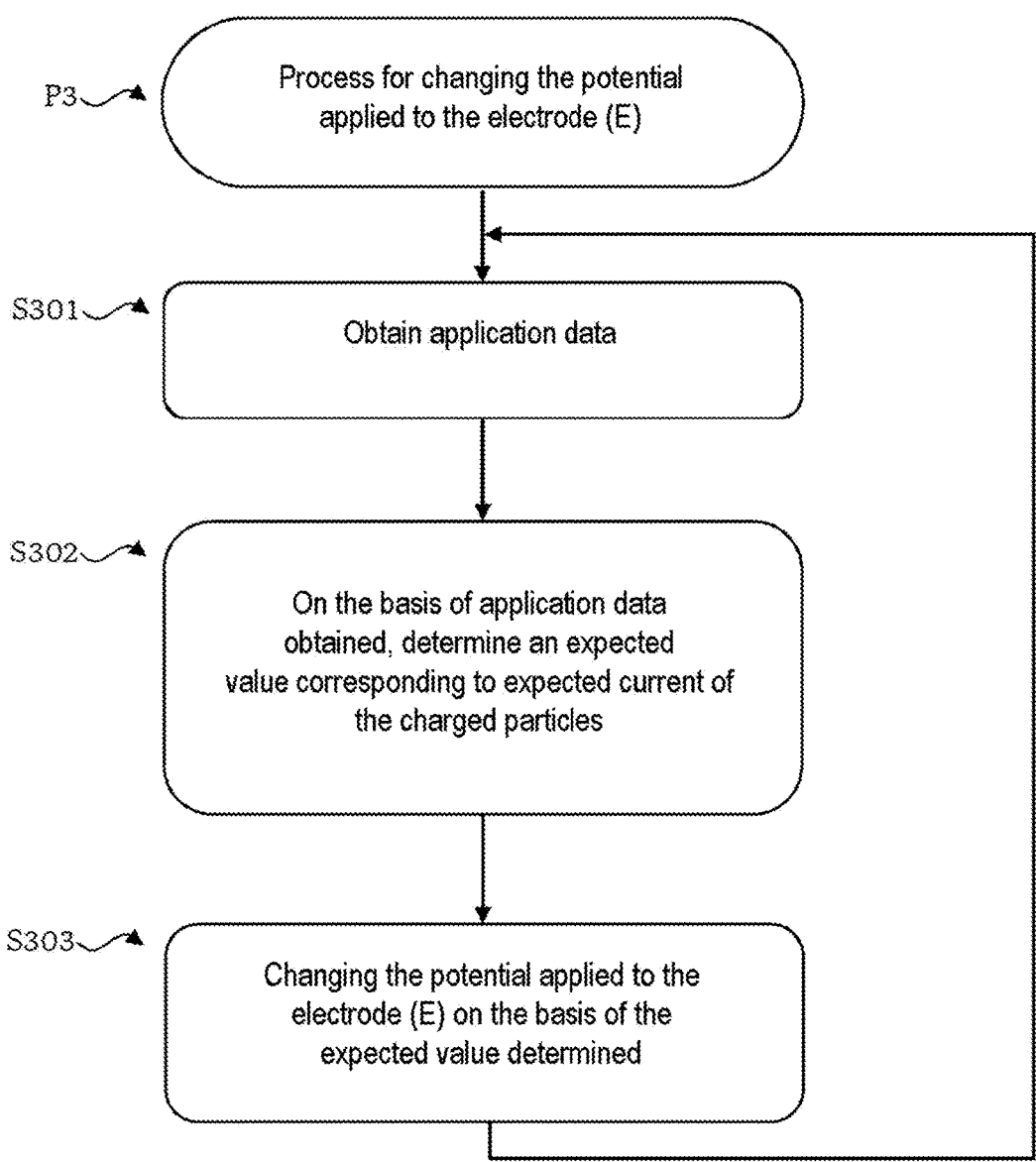
FIG. 5 shows an exemplary process for changing the electrical potential applied to the electrode.

In addition or as an alternative to the detection signal, other information can also be used by the controller 30 in order to ascertain the desirability of changing the electrical potential applied to the electrode E and to change the potential. FIG. 5 shows an exemplary process P3 for changing the electrical potential applied to the electrode E on the basis of application data.

FIG. 5 shows an exemplary third process P3 for changing the electrical potential applied to the electrode.

In step S301, the controller 30 obtains application data from the data storage unit 31. The application data specify for example a chemical composition of the sample 3, a current intensity of the particle beam 2 and the like.

In step S302, the controller 30 determines an expected value specifying an expected current composed of the charged particles 41. The expected value is determined using a forecast model, for example, into which the application data are input and which outputs the expected value. The forecast model can for example be implemented by an artificial neural network or the like and be trained by experiments.

In step S303, on the basis of the expected value determined in step S302, the controller 30 determines whether or not the potential applied to the electrode E ought to be changed and changes the potential if appropriate. By way of example, the controller 30 can be configured to reduce the potential if the expected value determined is greater than a third limit value. The third limit value is stored in the data storage unit 31, for example, and specifies as of what value of the expected value the presence of saturation is expected. The third limit value can be adjusted by a user and can be determined empirically, for example. By way of example, the controller 30 can be configured to increase the potential if the expected value determined is less than a fourth limit value. The fourth limit value is stored in the data storage unit 31, for example, and specifies as of what value of the expected value the presence of a potential adjusted to be too low is expected. The fourth limit value can be adjusted by a user and can be determined empirically, for example.

In accordance with a further exemplary process for changing the electrical potential applied to the electrode E, the electrical potential applied to the electrode E is increased and the gain of the light detector 44 is reduced in order to increase (i.e. improve) the signal-to-noise ratio of the detection signal In general, the signal-to-noise ratio of the detection signal is better if the gain of the light detector 44 is chosen to be lower and the potential is adjusted to a higher value in order to compensate for the low gain.

Figure 6:
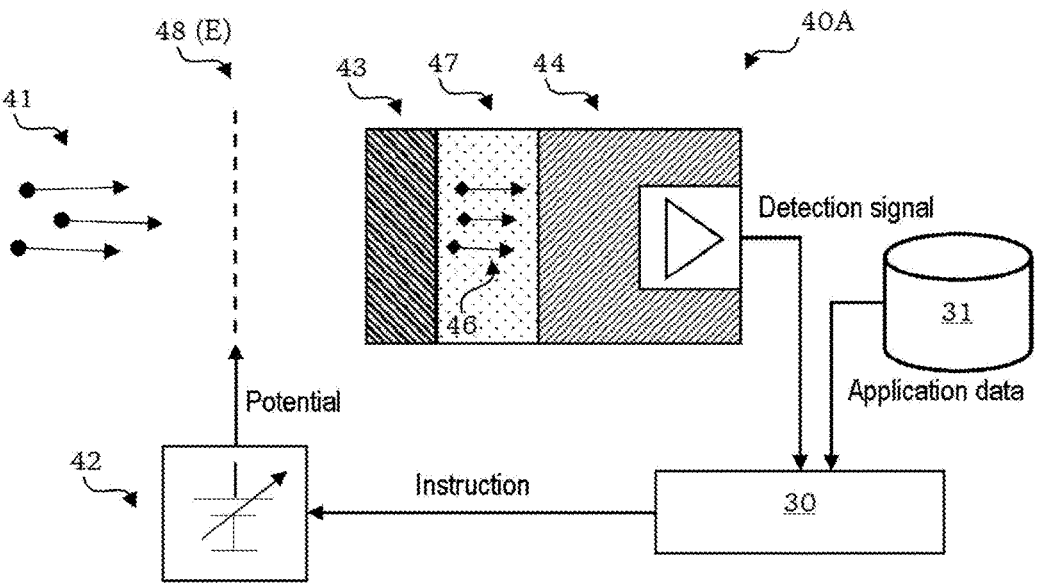
FIG. 6 shows an exemplary configuration of a detection system.

FIG. 6 shows a further exemplary configuration of a detection system 40A. The detection system 40A differs from the detection system 40 described with reference to FIG. 2 only in that the electrode E is provided by the collector electrode 48 arranged at a distance from the scintillator 43, and in that the metal grid 45 is not provided. The detection system 40A can be developed further by an adjustable electrical potential also being applied to the scintillator 43.

Figure 7:
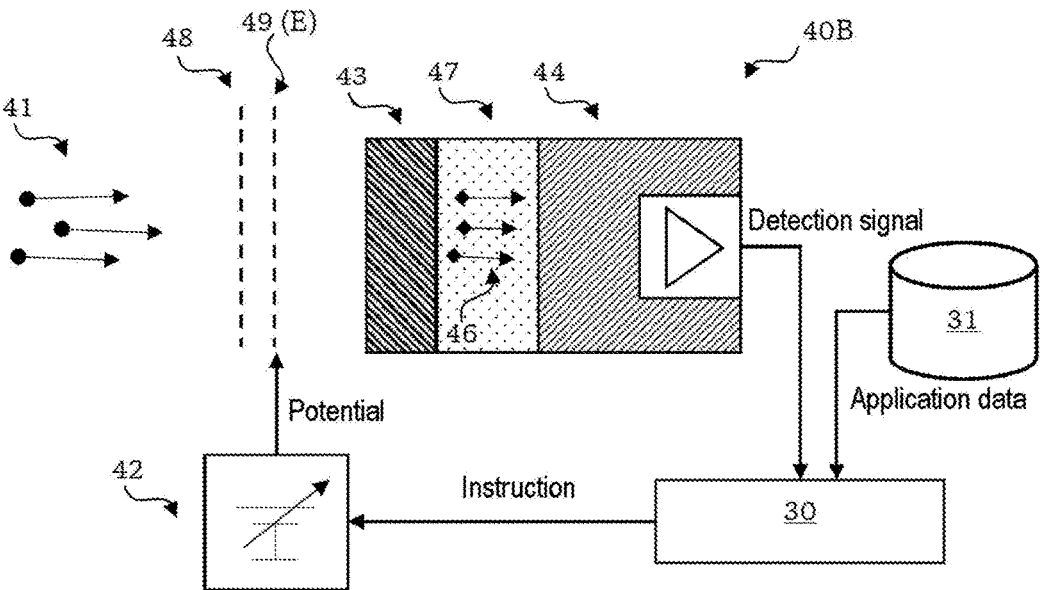
FIG. 7 shows an exemplary configuration of a detection system.

FIG. 7 shows a further exemplary configuration of a detection system 40B. The detection system 40B differs from the detection system 40 described with reference to FIG. 2 only in that the electrode E is provided by a grid electrode 49 arranged between the scintillator 43 and the added collector electrode 48 at a distance from the scintillator 43 and the collector electrode 48, and in that the metal grid 45 is not provided. The detection system 40B can be developed further by an adjustable electrical potential also being applied in each case to the scintillator 43 and to the collector electrode 48.

As is shown in FIG. 1, the electrode E and the scintillator 43 of the detection system 40 can be arranged in the interior of the vacuum chamber 25. As is likewise shown in FIG. 1, however, the electrode E and the scintillator 43 of the detection system 40 can also be arranged in the interior of the particle beam column 10. In the example in FIG. 1, the electrodes E and the scintillators 43 of two detection systems 40 are arranged in the interior of the beam tube 15 of the particle beam column 10. These are arranged between the acceleration electrode 13 and the particle-optical lens 19, as viewed along the central axis 23. It is not necessary for the light detector 44 of these detection systems 40 likewise to be arranged in the interior of the particle beam column 10 or in the interior of the beam tube 15. Instead, the light guide 47 can guide the light 46 generated by the scintillator 43 in the interior of the particle beam column 10 through a housing of the particle beam column 10 and the light 46 is then detected by a light detector 44 arranged outside the housing of the particle beam column 10. Alternatively, the electrode E can be provided by the beam tube 15 of the particle beam column 10.

The electrical potential applied to the electrode E generates an electric field between itself and other parts of the particle beam system 1 and the sample 3 if these have a different electrical potential. Therefore, the electrical potential applied to the electrode E can generate an electric field which lies in the region in which the particle beam 2 passes. This can adversely influence the particle beam 2 since the particle beam 2 can be deformed, displaced and deflected. Some possibilities which reduce the adverse influence are presented below.

By way of example, the particle beam column 10 comprises a component for manipulating the particle beam 2, the component being controlled by the controller 30 such that the influence of the electrode E and of the electrical potential applied to the electrode E on the particle beam 2 is reduced. Examples of the component for manipulating the particle beam 2 are the particle-optical lens 19 and the deflection system 21. The particle beam system 1 can comprise further particle-optical lenses and deflection systems which are provided in a dedicated manner for compensating for the influence of the electrode E and of the electrical potential applied to the electrode E on the particle beam 2. For this purpose, the controller 30 can be configured to control the component for manipulating the particle beam 2 on the basis of a signal indicating the potential.

The control algorithm to be executed by the controller 30 for controlling the component for manipulating the particle beam 2 can be stored in the data storage unit 31. The control algorithm can be previously determined by simulation, for example. Alternatively or additionally, the control algorithm can be determined experimentally by experimental determination of correction values for the operating parameters which involve reduction of the measured influence (i.e. for example the deformation, displacement and deflection of the particle beam 2). Furthermore, an image displacement, image rotation, image distortion, etc., caused by a change in the potential applied to the electrode E in images recorded by the particle beam system 1 can be determined by the controller 30, and the controller 30 can control the component for manipulating the particle beam 2 on the basis thereof.

By way of example, the particle beam column 10 comprises a shielding element 51, which electromagnetically shields the particle beam 2 from the electrode E. The shielding element 51 is designed and arranged such that the particle beam 2 passes outside a main effective region 52 of an electric field generable by the electrode E. In the example shown in FIG. 1, the shielding element 51 is a plate which is arranged along the central axis 23 at a distance from the central axis 23 and which is arranged between the central axis 23 and the electrode E. The shielding element 51 delimits the main effective region 52 of the electric field generated by the electrode E to a spatial region arranged at a distance from the central axis 23 and the particle beam 2.

Figure 8:
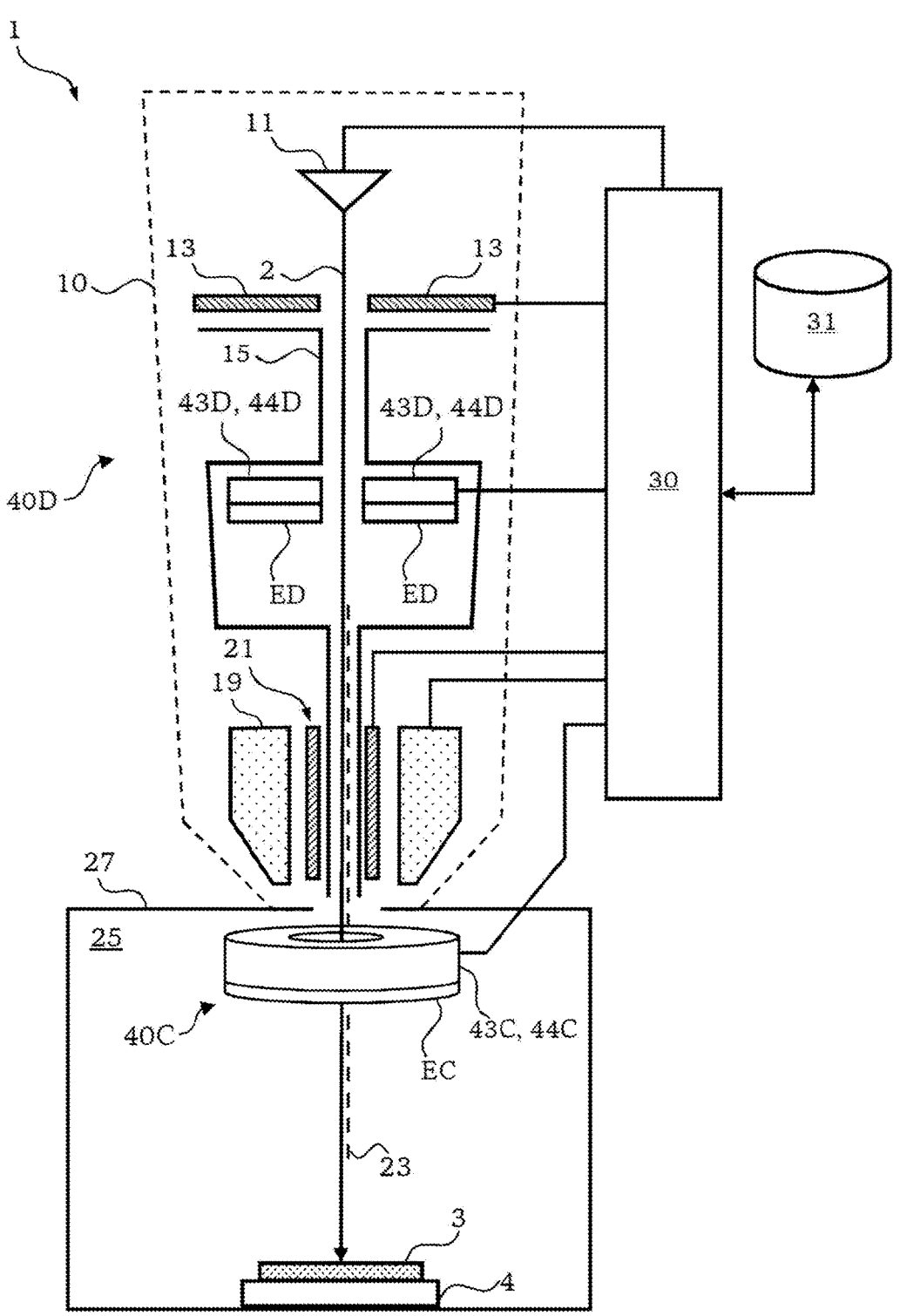
FIG. 8 shows an exemplary configuration of a detection system in a particle beam system.

FIG. 8 shows the particle beam system 1 with an alternative detection system 40C and alternative detection systems 40D. The electrode EC, the scintillator 43C and the light detector 44C are arranged in a ring-shaped manner around the central axis 23 in the vacuum chamber 25. Only the potential source 42 (not illustrated) of the detection system 40C is arranged outside the vacuum chamber 25. Owing to the symmetry, the radial components of the electric field generated by the electrode EC (i.e. the components of the electric field which are oriented perpendicularly to the central axis 23) approximately cancel one another out, as a result of which the influence on the particle beam 2 is reduced.

The electrodes ED of the detection systems 40D are arranged around the central axis 23 such that the effects of the potentials applied to the electrodes ED of the detection systems 40D (or of the electric field formed jointly by the electrodes ED) at least partly cancel one another out in the region of the central axis 23. In the example shown in FIG. 8, two detection systems 40D are arranged in the interior of the beam tube 15. Owing to the symmetry of the arrangement of the detection systems 40D, the radial components of the electric fields generated by the electrodes ED (i.e. the components of the electric field which are oriented perpendicularly to the central axis 23) approximately cancel one another out, as a result of which the influence on the particle beam 2 is reduced.

Figure 9:
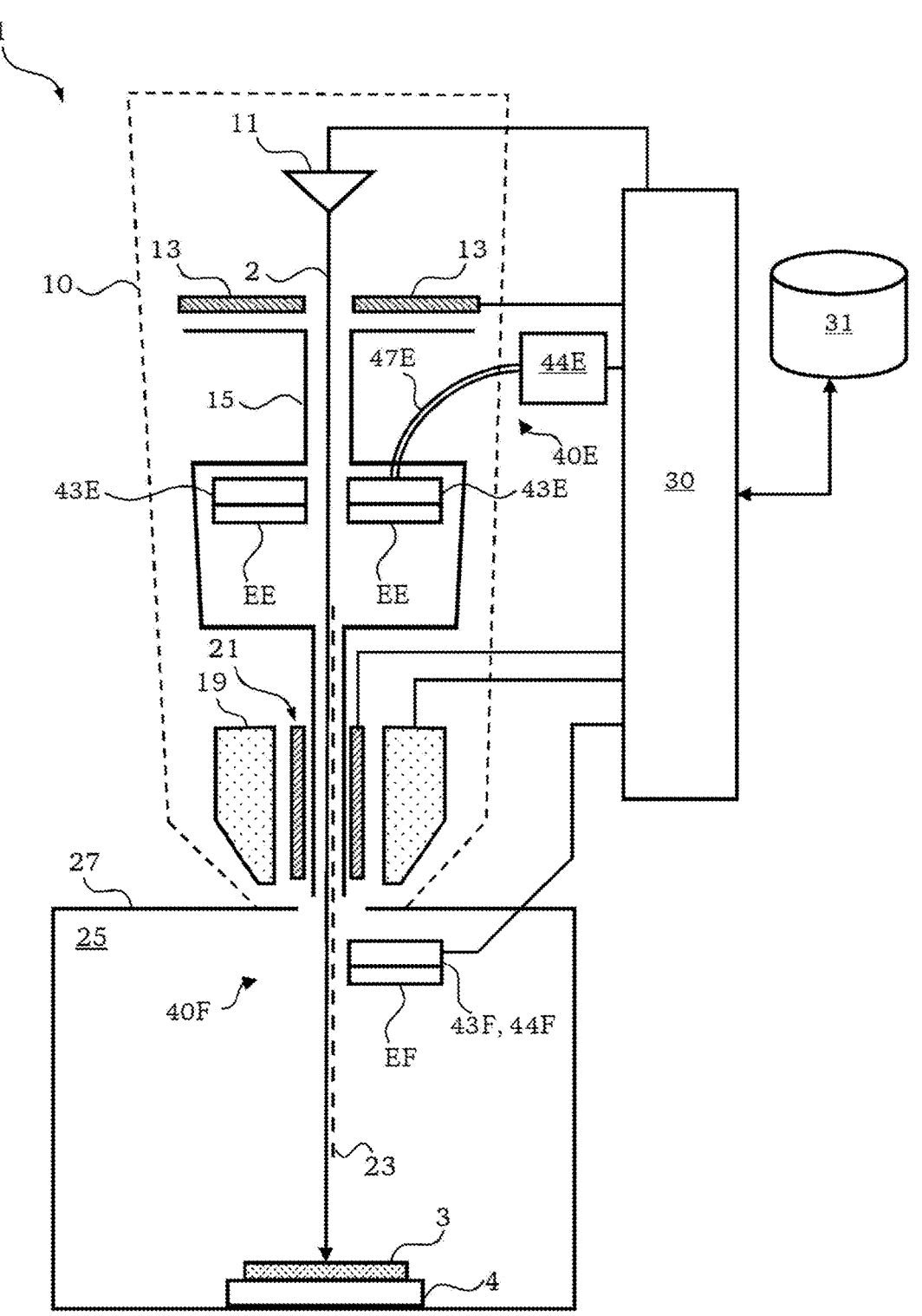
FIG. 9 shows an exemplary configuration of a detection system in a particle beam system.

FIG. 9 shows the particle beam system 1 with an alternative detection system 40E and an alternative detection system 40F. The electrode EE of the detection system 40E and the scintillator 43E of the detection system 40E are arranged in the particle beam column 10, in particular in the beam tube 15. A light guide 47E guides the light generated by the scintillator 43E to the light detector 44E arranged outside the beam tube 15, in particular outside the particle beam column 10. In accordance with one modification of the detection system 40E, the electrode EE is formed by the beam tube 15. Apart from the potential source, the detection system 40F is situated completely within the vacuum chamber 25. That is to say that the electrode EF, the scintillator 43F and the light detector 44F of the detection system 40F are arranged within the vacuum chamber 25. In contrast to the detection system 40C shown in FIG. 8, the electrode EF and the scintillator 43F of the detection system 40F are not formed symmetrically about the central axis 23.

Figure 10:
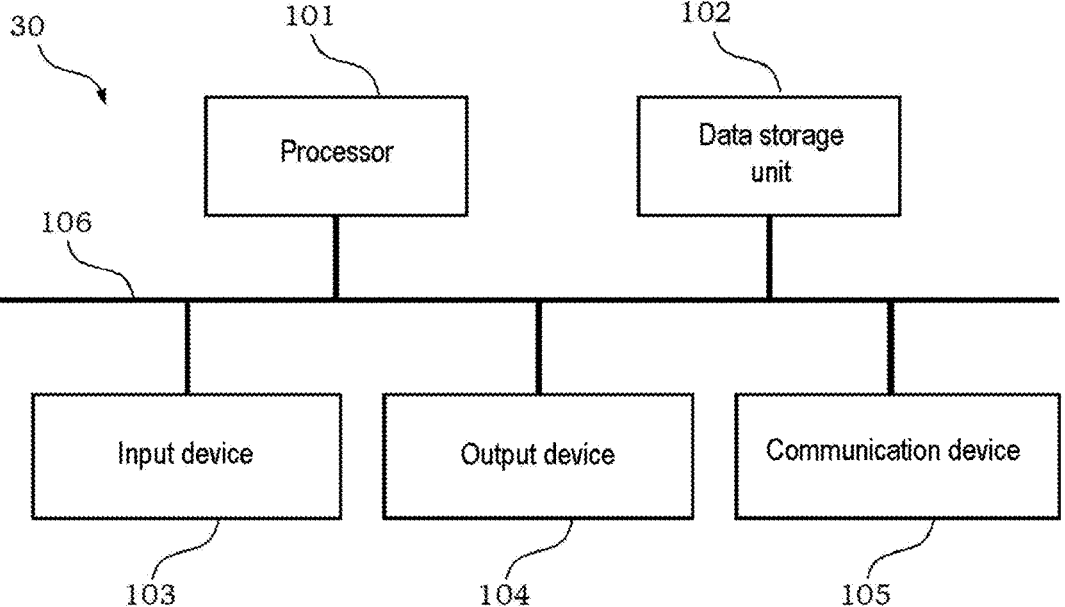
FIG. 10 shows an exemplary configuration of a controller.

FIG. 10 shows an exemplary configuration of the controller 30. In this example, the controller 30 comprises a processor 101, a data storage unit 102, an input device 103, an output device 104 and a communication device 105. The processor 101, the storage unit 102, the input device 103, the output device 104 and the communication device 105 can exchange data with one another via one or more buses 106.

The processor 101 executes programs stored in the data storage unit 102. Algorithms, in particular control algorithms, are executed as a result.

The data storage unit 31 is implemented by the data storage unit 102, for example. The data storage unit 102 can comprise a recording medium on which one or more computer-readable programs are recorded, and can store all kinds of data.

The input device 103 is configured to receive inputs by a user and to store the data associated therewith in the data storage unit 102. The input device 103 comprises a keyboard and a mouse, for example.

The output device 104 is configured to present data to a user. The output device 104 comprises a display screen, for example.

The communication device 105 is configured to transmit and receive data to and from other components of other systems.

The processor 101 can comprise one or more CPUs, DSPs (digital signal processors) and the like. Examples of the storage unit 102 are a non-volatile or volatile semiconductor memory and the like. Examples of the non-volatile or volatile semiconductor memory are a random access memory (RAM), a read-only memory (ROM), a flash memory, an erasable programmable read-only memory (EPROM) and the like.

What is claimed is:

1. A particle beam system, comprising:
a particle beam column configured to generate a particle beam and to direct the particle beam onto a sample to emit charged particles from the sample;
a detection system configured to detect the charged particles, the detection system comprising:
an electrode;
a potential source;
a scintillator; and
a light detector, wherein the potential source is configured to apply an adjustable electrical potential to the electrode to accelerate the charged particles to the scintillator, the scintillator is configured to emit light due to an interaction of the charged particles with the scintillator, and the light detector is configured to detect the light emitted by the scintillator and to output a detection signal corresponding to the detected light; and
a controller configured to control the potential source and to change the adjustable electrical potential based on the detection signal so that the scintillator operates outside its saturation and the light detector operates outside its saturation.

2. The particle beam system of claim 1, wherein:
the light detector is configured to amplify a signal of the detected light with a gain which is adjustable up to a maximum gain, and to output the amplified signal as the detection signal; and
the adjustable electrical potential is adjustable based on the detection signal so that the light detector is operable outside its saturation when the light detector is adjusted to its maximum gain.

3. The particle beam system of claim 1, wherein:
the light detector is configured to amplify a signal of the detected light with a gain of the light detector which is adjustable up to a maximum gain, and to output the amplified signal as the detection signal; and
the controller is configured to increase the adjustable electrical potential and to reduce the gain of the light detector to increase a signal-to-noise ratio of the detection signal.

4. The particle beam system of claim 1, wherein the controller is configured to:
reduce the adjustable electrical potential when the detection signal is greater than a first limit value; and
increase the adjustable electrical potential when the detection signal is less than a second limit value.

5. The particle beam system of claim 1, further comprising a collector electrode spaced apart from the scintillator, wherein the collector electrode is configured to have an adjustable electrical potential applied thereto to accelerate the charged particles, and the electrode comprises a grid electrode between the collector electrode and the scintillator.

6. The particle beam system of claim 1, wherein the electrode and the scintillator are in an interior of the particle beam column.

7. The particle beam system of claim 6, wherein the electrode comprises a beam tube of the particle beam column configured so that the particle beam passes through the beam tube.

8. The particle beam system of claim 6, wherein the electrode is in an interior of a beam tube of the particle beam column configured so that the particle beam passes through the beam tube.

9. The particle beam system of claim 1, wherein the particle beam column comprises a component configured to manipulate the particle beam, and the controller is configured to control the component based on a signal specifying the adjustable electrical potential.

10. The particle beam system of claim 1, further comprising a shielding element configured to electromagnetically shield the particle beam from the electrode, wherein the shielding element is configured so that the particle beam passes outside a main effective region of an electric field generated by the electrode.

11. The particle beam system of claim 1, wherein the electrode and the scintillator are arranged in a ring-shaped manner around a central axis of the particle beam column.

12. The particle beam system of claim 1, wherein the detection system comprises a plurality of detection systems, electrodes of the plurality of detection systems being arranged around a central axis of the particle beam column so that effects of the adjustable electrical potentials applied to the electrodes of the plurality of detection systems at least partly cancel one another out in a region of the central axis.

13. The particle beam system of claim 1, further comprising a vacuum chamber in which the sample is disposed, wherein the vacuum chamber is configured to have a pressure of at most 0.1 pascal.

14. The particle beam system of claim 1, further comprising a vacuum chamber in which the sample is disposed, wherein the vacuum chamber is configured to have a pressure of at least 1 pascal.

15. The particle beam system of claim 1, wherein the controller comprises a processor, a data storage unit, an input device, and an output device.

* * * * *